United States Patent [19]

Olson et al.

[11] Patent Number: 4,721,661

[45] Date of Patent: Jan. 26, 1988

[54] SELECTIVELY REMOVING UNWANTED MAGNETIC TONER FROM MAGNETIC MEMBER TO PROVIDE UNIFORM HIGH RESOLUTION IMAGE

[75] Inventors: Richard A. Olson, Newark; Frederick W. Saunders, III, Wilmington, both of Del.

[73] Assignee: E. I. Du Pont de Nemours and Company, Wilmington, Del.

[21] Appl. No.: 827,442

[22] Filed: Feb. 10, 1986

[51] Int. Cl.[4] .................... G03G 21/00; G03G 19/00
[52] U.S. Cl. .................................... 430/39; 430/125; 355/15; 118/652
[58] Field of Search .................... 430/39, 125; 355/15; 118/652

[56] References Cited

U.S. PATENT DOCUMENTS

| | | |
|---|---|---|
| 2,752,271 | 6/1956 | Walkup et al. ............... 430/125 X |
| 3,514,803 | 6/1970 | Turney, Jr. .................. 15/306 R |
| 3,741,157 | 6/1973 | Krause . |
| 3,787,877 | 1/1974 | Nacci et al. ................. 430/39 X |
| 4,014,065 | 3/1977 | Hudson ....................... 15/306 R |
| 4,093,369 | 6/1978 | Hewitt ........................ 118/652 X |
| 4,233,382 | 11/1980 | Edwards et al. ............... 430/39 |
| 4,260,235 | 4/1981 | Stack ......................... 355/3 CH |
| 4,338,391 | 7/1982 | Nacci et al. .................. 430/122 |

Primary Examiner—Roland E. Martin

[57] ABSTRACT

Improved magnetic toner resolution obtained with vacuum device with terminal lips having squared off edges with lips parallel to rotation axis of printing plate but offset at angle of 5° to 60°.

11 Claims, 1 Drawing Figure

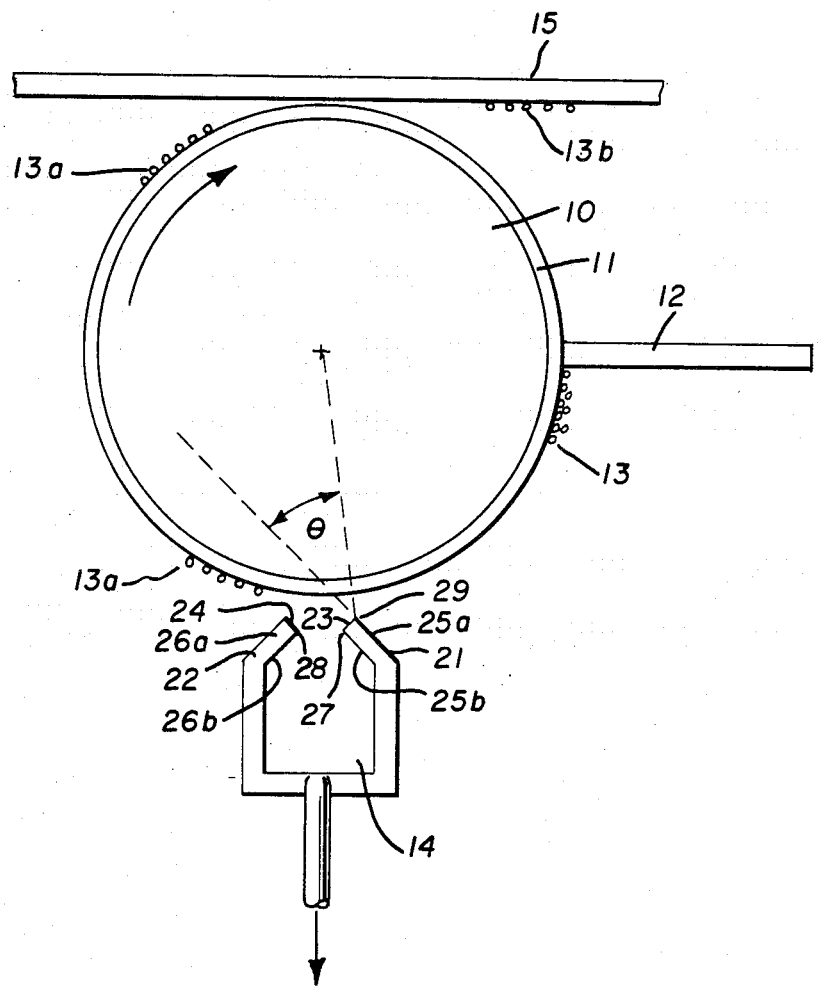
FIGURE

SELECTIVELY REMOVING UNWANTED MAGNETIC TONER FROM MAGNETIC MEMBER TO PROVIDE UNIFORM HIGH RESOLUTION IMAGE

BACKGROUND OF THE INVENTION

The present invention relates to a process of developing a high resolution image on a surface of a magnetic member with a dry magnetic toner with removal of excess toner on the magnetic member followed by transfer of the toner to a substrate preferably using heat and pressure. The present invention is particularly adapted to the formation of a high resolution image which serves as a resist in the manufacture of printed circuit boards.

Turney U.S. Pat. No. 3,514,803, Krause U.S. Pat. No. 3,741,157, Hudson U.S. Pat. No. 4,014,065, Stack U.S. Pat. No. 4,260,235 and Edwards et al. U.S. Pat. No. 4,233,382 discloses various techniques and structural designs in selectively removing unwanted powder material from a substrate. U.S. Pat. No. 3,514,803 discloses apparatus using opposed elongated vacuum nozzles, one nozzle to lift free powder with a second nozzle to resist lifting of a sheet substrate. U.S. Pat. No. 3,741,157 discloses use of a nozzle with a plurality of jets of air directed onto a surface with vacuum means to carry away dislodged material. U.S. Pat. No. 4,014,065 discloses a system for removing unwanted particles containing a magnetic developer material. The removal means contains a chamber having entrance and exit ports with the cross section of the entrance to exit port being sufficiently small to assure substantially uniform air flow across the entrance port when the chamber is subjected to negative pressure through the exit port. The patent discloses that the developed surface of the circular member is subjected to substantially uniform shearing air flow and the suction device contains an arcuate terminal portion which extends along the cylindrical member containing the latent magnetic image. U.S. Pat. No. 4,260,235 discloses a magnetic developer removal system to remove excess developer material from a circular member having a latent magnetic image developed with vacuum scavenging chamber whereby the leading edge of the scavenging chamber is given a curved shape to aid in creating a venturi and a trailing edge shaped as knife edge. U.S. Pat. No. 4,233,382 discloses a process for reproducing graphic information by forming a magnetic image in a premagnetized layer of chromium dioxide with heating of the chromium dioxide to above its Curie point in selected areas. Uncharged ferromagnetic toner particles are applied uniformly to the chromium dioxide layer but adhere only to the magnetized areas. Excess toner particles are removed by a vacuum knife. The toner particles are electrostatically transferred to a substrate.

Nacci et al. U.S. Pat. No. 4,338,391 discloses a process of forming an image of toner on a latent magnetic image in a magnetic member followed by direct transfer to a surface with coalescence of the toner. Excess background toner is removed from nonmagnetized background areas of the magnetic member by means of a vacuum knife, air knife or combination thereof. The surface which is not protected by the transferred toner is then permanently modified by etching or plating.

The present invention is an improvement over the process disclosed in Nacci U.S. Pat. No. 4,338,391 in the step of removing background toner from a image magnetic toner on a magnetic member followed by transfer of the magnetic toner image to a substrate.

SUMMARY OF THE INVENTION

The present invention is directed to a process which comprises applying magnetic toner to a rotating magnetic member held in a circular configuration, said member having magnetized and nonmagnetized areas whereby a toner image is formed on the magnetized areas, passing air adjacent to the magnetic member to remove excess toner and transferring by pressure contact the toner image to a substrate wherein the improvement comprises minimizing tangential air flow to the magnetic member by employment of a suction device terminating in lips whose terminal faces are parallel to the axis of rotation of the magnetic member with at least one of the lips having a terminal face which forms two separate substantially perpendicular edges and wherein the plane of the one lip intersects a plane extending from the axis of rotation of the magnetic member to the closest edge of the one lip to the magnetic member forming an angle in the range from 5° to 60°.

DESCRIPTION OF FIGURE

The FIGURE represents a schematic end view of a substrate, a magnetic member having toner therein and a suction device.

With reference to this FIGURE is present a drum 10 which rotates (in direction shown by the arrow) and has a magnetic member 11 present along its circumference. A toner applicator 12 applies toner 13 which adheres primarily to magnetized portions of the magnetic member. A suction device 14 removes excess toner from the surface of the magnetic member with toner 13a remaining on the magnetic member for transfer to substrate 15. Toner 13b represents toner transferred to the substrate.

The suction device has lips 21 and 22 which terminate in terminal faces 23 and 24 having side wall portions 25a, 25b and 26a and 26b respectively. In a preferred mode both side walls are perpendicular to their respective terminal faces. Edges 27 and 28 of the terminal faces of the lips 21 and 22 are parallel to one another and are also parallel to the axis of rotation of the magnetic member (since the vacuum device with its lips extend along the length of the drum).

Additionally shown in the FIGURE is a dotted line (which represents a plane due to the end view) which extends from the closest edge 29 of one lip to the axis of rotation of the magnetic member and a second dotted line (which likewise represents a plane due to the end view) which extends from the edge 29 of one lip perpendicular to the terminal face 23. The intersection of the dotted lines forms an angle illustrated as $\theta$.

DETAILED DESCRIPTION OF THE INVENTION

The present invention aids to provide a toner image of high resolution by formation of a magnetically held image of multiple toner layers on a magnetic member followed by transfer of the toner. The present invention is an improvement of the toner transfer process of Nacci et al. U.S. Pat. No. 4,338,341 which is incorporated by reference herein.

Initially a magnetic member conventionally called a printing plate is employed. Generally the printing plate is made from chromium dioxide since such material has a low Curie point which facilitates selective thermal demagnetization. The magnetic member initially is magnetized to obtain magnetic structuring such as in the range from 350 to 2000 magnetic lines per inch and more preferably from 500 to 1000 magnetic lines per inch. A magnetic line contains one north pole and one south pole.

The magnetic member is demagnetized in portions wherein magnetic toner should not adhere. A technique for obtaining an image pattern on this member is by heating portions of the member to above its Curie temperature, e.g., employing noncollimated or collimated light through artwork having opaque and transparent areas. Any technique for imaging the magnetic member can be employed, e.g., use of either a laser programmed to scan the printing plate, a flash lamp or electronic recording.

Formation of a high resolution toner image on the magnetic member is essential in a preferred use of the toner image in making a printed circuit board, particularly with dense circuitry. The trend in making circuit boards is to compress the circuitry with narrow conductor paths and narrow insulating spaces (also called lines and spaces herein). As circuitry on a printing board becomes more dense, bridging of adjacent conductive areas can more readily occur which creates a need for high resolution in the application of magnetic toner. The toner image is preferably free of pin holes to minimize the chance of defects.

In application of toner to the magnetic member wound around a drum which rotates in use to allow attraction of the toner to magnetized areas followed by pressure contact transfer to a substrate such as copper panel. Excess toner adheres to background nonmagnetized areas of this member which is undesirable since such toner is transferred in the pressure contact step onto a substrate. Use of a vacuum is employed to remove such toner which likewise removes some toner particles from magnetized areas where an excessive height of toner is present.

In prior art processes the vacuuming conditions to obtain an optimum magnetic image with substantially no background toner and removal of excess toner requires a careful balance of conditions to optimize such process. For a particular suction device and a specific magnetic toner, the higher the vacuum setting of the device, the higher will be the air velocity across a portion of the magnetic member where the air enters the suction device. Consequently better removal or cleanout such as background toner occurs and the lines of magnetic material and spaces between the lines can be made closer in optimization of the process. However if such removal, i.e., cleanout, of background toner is too aggressive, an excessive amount of toner will also be removed from areas where it should not be removed, i.e., on magnetized portions of the printing plate.

In production of circuit boards the effect air velocity due to excessive vacuum will result in ragged and/or broken conductors. Too little air velocity will cause ragged edges, if the suction step is so mild that it fails to completely remove toner from unmagnetized areas. In such case, the toner lines will be wider than intended. At the same time unwanted bridging across the space between adjacent lines of toner can occur. If the case of manufacture of a printed circuit board such bridging can directly result in a defective board.

The present invention is considered to optimize this prior art vacuum step by the manner in which air flows across the surface of the circular magnetic member into the suction device. The manner in optimizing this vacuum step involves a reduction in the tangential flow of air across the surface of the magnetic member, i.e, the air flow parallel to the surface of the magnetic member is minimized which in turn aids to maximize the air flow perpendicular to the magnetic member. Such technique is directly contrary to a technique such as disclosed in Hudson U.S. Pat. No. 4,014,065 which employs an arcuate section along a roll to direct air around the surface of the roll prior to entry into a vacuum chamber. Based on a need to minimize the tangential air flow across the magnetic member, one type of suction device could have outlet lips which are extremely narrow, i.e., an extended knife edge. However such type of device with such outlet lips is highly undesirable for several reasons. From a practical standpoint substantial difficulty is presented in high precision formation of lips with an extremely thin wall construction. For example to obtain rigidity, use of a metal would be conventionally necessary requiring a grinding operation. However with such grinding to create a knife edge, nonuniformity is introduced in the edge of the lips such as due to a wavy pattern which in turn creates nonuniformity in toner removal from the printing plate. Also from a safety standpoint an operator hazard is introduced due to the sharpness of the nozzle.

In the present invention the above difficulties are overcome by use of a lip portion in which the terminal portion of at least one lip is substantially perpendicular. Substantially perpendicular means the terminal portion, i.e., the face, of the lip forms substantially two right angles (i.e., the two side walls of the lip form right angles with the end of the lip). Preferably the wall portion of the lip is of substantially uniform thickness. Different results were obtained in tests with when two right angles were not present. For example a lip which terminated in one right angle and one 45° angle obtained inferior results compared with a lip having two right angles.

With substantially perpendicular lip edges a further requirement is that the plane at least one of the lips does not lie in the same plane as a plane extending from the centerline of the magnetic member (or its axis of rotation) to the lip edge but is offset at an angle. Therefore at least one such lip does not form an angle of 0° with such plane. At least one lip lies in a plane which forms an angle in the range from 5° to 60° and more preferably from 30° to 45° with the plane of the centerline (or axis of rotation) of the magnetic member to such lip. In a preferred configuration both lips have substantially square (i.e., perpendicular) edges and are offset within the stated values. The angle of offset can be in either direction from 0°. A preferred orientation is with the lips facing toward one another to aid in creating a larger inlet vacuum opening in the throat of the suction device. Since the lips extend across the width of the circular printing plate, they will be parallel to one another even though they do not need be symmetrical to each other, i.e., held at the same angle to the printing plate.

The advantage of having substantially perpendicular lips edges which are held at an angle to the circular printing plate is that the outermost projection of the lip which is closest to the printing plate is an extremely thin edge, i.e., the corner formed by two substantially perpendicular planes. This manner of presenting an edge to form a lip of the suction device allows a minimization of velocity component of air flow tangential to the surface of the magnetic member.

The configuration of the lip allows both thin and thick lips to be employed, e.g., in the range from 5 to 200 mils. However in a preferred mode a thin lip configuration will be employed in the range of wall thickness from 5 to 15 mils.

Generally the printing plate will be mounted on a drum having a circumference of at least 15 inches and generally at least 30 inches. A typical clearance between the closest edge of the lip to the outer surface of the printing plate mounted on the drum will be in the range of 8 to 15 mils with a vacuum range in the plenum of the suction device of 0.1 to 0.5 inches $H_2O$. A toner height on the printing plate prior to vacuuming will be in the range from 0.5 to 5 mils, and more typically 2 to 5 mils.

After formation of the toner image on the surface of the printing plate followed by removal of excess and background toner using the process disclosed herein, the toner is transferred from the printing plate to a substrate surface typically a copper panel by pressure contacting preferably employing an elevated temperature such as in the range from 90° C. to 110° C. whereby the toner partially coalesces on contact with the substrate. Such conditions of transfer can be employed using the teachings of Nacci U.S. Pat. No. 4,338,391 incorporated by reference herein.

To further illustrate the present invention the following examples are provided. All parts and percentages are by weight and degrees in centigrade unless otherwise stated.

EXAMPLE 1

A CIRTRAK® Printing Plate 27 inches (69 cm) long, and comprising an acicular chromium dioxide binder matrix on polyester film with a magnetic layer thickness of 420 microns, magnetically structured at 400 magnetic lines per inch was thermally imaged with a pattern ranging from alternating 6 mil lines and 6 mil spaces to 15 mil lines and 15 mil spaces. Following thermal imaging, the plate was mounted on the 9.7 inch (24.6 cm) diameter printing roll.

The toner used was composed of Atlac 382 ES polyester resin (a propoxylated bisphenol-A), fumaric acid polyester having a tack point of 70° C. and a liquid point of 199° C., a molecular weight of 2500-3000 and a Tg of 58° C.), BASF Magnetic Pigment 345 having an average size of 0.8 $\mu$m, triphenyl phosphate, ethylene vinylacetate copolymer (S.P. 82°) and polyethylene wax (S.P. 113° C.). The toner also contained fumed silica which imparted fluidity to the toner. The average particle size of the toner was 12-14 $\mu$m.

The toner was placed in a CIRTRAK® toner applicator. The applicator was activated and moved close to the printing roll so the fluidized toner contacted the printing roll. The printing roll drive was activated to move the preimaged magnetic printing plate through the fluidized wave of toner and cause the magnetic toner to adhere to the magnetized areas containing 6 to 15-mil wide images. The toned printing plate was then rotated past a suction device to remove unwanted toner and thus sharpen the image's resolution.

To effect transfer of the toned image, the printing roll was rotated into position. The circuit board blank preheated to 210° F. (99° C.) by an oven, followed by contact with heated rolls with a platen was pushed into a roll nip and contacted with the toned image rotating through the nip at a speed of 30 ft/min (15.2 cm/sec) and a force of 20-25 pounds per lineal inch of width of the circuit board. The circuit board with the printed resist was deposited beyond the nip.

For any suction device design, the higher the vacuum level, the greater the cleanout possible, but there is a limiting vacuum level where image damage occurs, i.e., where cleanout becomes excessive. This damage is termed "tearout". Hence, each suction device has a "resolution limit", which is defined as the finest alternating lines and spaces which can be completely resolved (cleaned out) without exceeding an acceptable level of tearout. The suction device which gives the lowest resolution limit is considered the best.

Each suction device was tested at 10 and 30 mil clearances to the printing plate surface. At each clearance, a series of panels were printed, using a variety of vacuum levels over a span chosen such that the lowest vacuum level did not satisfactorily remove unwanted toner from nonimage areas (inadequate cleanout and the highest vacuum level caused excessive image damage (tearout).

The printed "resolution patterns" which consisted of alternating lines and spaces (L/S) of 6, 8, 10, 12 and 15 mil sizes, were subsequently inspected and assigned quality ratings.

For each print, cleanout efficiency (0-100%) was estimated for each L/S size. Ultimately, graphs of cleanout efficiency vs. vacuum level were obtained for each L/S size.

The same printed "resolution patterns" were given numerical "tearout" ratings (1-10 basis) to obtain graphs of tearout vs. vacuum level for each L/S size. Tearout is excessive removal of toner from the lines which is undesirable. A numerical value of tearout rating was chosen to represent the worst tearout which was considered acceptable. This value was entered into the prior graph to find the limiting (maximum) vacuum level.

A graph of % cleanout vs. L/S size was construed at the limiting vacuum level. Finally, the L/S size corresponding to 99% cleanout efficiency was taken from this graph, to represent the "resolution limit" for the suction device. In some cases the resolution limit was found to be less than the 6 inch L/S on the test pattern which was determined to graphical extropolation.

The suction device had first and second lips extending across the width of the printing plate with interior parallel walls for removing air and toner from the opening of the device. The interior parallel walls directly forced the center portion of the roll holding the printing plate. The extremity of the suction device closest to the printing plate (face) was 20 mils in thickness with a 90° angle of the lip and the interior parallel walls and a 135° angle at the outer lip wall (measured from the parallel interior walls) which made the walls thicker as the distance from the printing roll increased. The lips had a initial thickness of 400 mils. The use of this type of suction device lies outside the scope of the present invention.

At 30 mils clearance to the printing plate from the lip the resolution limit was found to be 9.6 mils L/S. At 10 mils clearance, its resolution limit was 10.0 mils.

EXAMPLE 2

The process of Example 1 was followed except in place of the single suction device used in this example another identical suction device was employed and mounted in series so that the printing plate passed both devices.

At 30 mils clearance to the printing plate, the resolution limit was found to be 9.7 mils L/S. At 10 mil clearance, its resolution limit was 5.7 mils.

This example likewise lies outside the scope of the present invention.

EXAMPLE 3

The process of Example 1 was followed except in place of its suction device, a new suction device was employed which contained different lips immediately adjacent to the printing plate. Rather than single front and rear lips, two lips were employed for the front and back each 40 mil thick, spaced 100 mils apart. Each lip was shaped in a pattern of a sine wave of approximately 0.5 inch amplitude and 1.2 inch period. The angle of the lips were zero degrees, i.e., perpendicular to the print surfaces, in similar fashion as Examples 1 and 2.

The resolution limit for this design at 30 mils clearance was 9.2 mils L/S. At 10 mils clearance, its resolution limit was 8.7 mils.

This design likewise lies outside the process of the present invention.

EXAMPLE 4

The process of Example 1 was followed except for the design of the suction device lips. The front and rear lips were of constant thickness and spaced 80 mils apart with the edge of the lips forming the vacuum nozzle having square edges and mounted symmetrically to the printing plate surface. Each lip formed an angle of 15° as measured to a plane extending from the axis of rotating of printing plate to the edge of the lip, i.e., the interior chamber of the suction device was larger as teh distance from the printing plate increased. Therefore the lips had an included angle of 30° between them.

This device had a resolution limit of 8.7 mils when located with 30 mils clearance to the printing plate surface. At 10 mil clearance, its resolution limit was 4.2 mils.

EXAMPLES 5 AND 6

The general procedure of Examples 1 to 4 was followed except the CIRTRAK® Printing Plate was magnetically structured at 600 magnetic lines per inch rather than 400 magnetic lines per inch and the pattern thermally imaged was 8 mil line and spaces to 16 mil lines and 16 mil spaces. Additionally each suction device was tested at 12 mil clearance to the printing plate surface.

Two different suction device designs were listed under these conditions.

The printed "resolution patterns", which consisted of alternating lines and spaces of 8, 10, 12, 14 and 16 mil sizes, were subsequently inspected and assigned quality ratings.

Two suction devices, identical except for lip thickness, were tested. The first suction device was identical to that used in Example 4. Lips which were 25 mil thick substituted for the 10 mil thick lips in the Example 4 device. Another suction device was employed as in Example 4 except 10 mil thick lips were used.

For both devices, the image quality was maximized varying the level of vacuum employed. The image quality was substantially identical for both devices although the thinner lip device could employ a slightly broader vacuum range to achieve comparable results.

What is claimed is:

1. In a process of applying magnetic toner to a rotating magnetic member held in a circular configuration, said member having magnetized and nonmagnetized areas whereby a toner image is formed on the magnetized areas, passing air adjacent the magnetic member to remove excess toner and thereafter transferring by pressure contact the toner image to a substrate wherein the improvement comprises minimizing tangential air flow to the magnetic member by employment of a suction device terminating in lips whose terminal faces along an edge thereof are parallel to one another and parallel to the axis of rotation of the magnetic member with at least one of the lips having a terminal face which forms two separate substantially perpendicular edges and wherein the plane of the one lip perpendicular to its terminal face intersects a plane extending from the axis of rotation of the magnetic member to the closest edge of the one lip to the magnetic member forming an angle in the range from 5° to 60°.

2. The process of claim 1 wherein the angle is in the range of from 30° to 45°.

3. The process of claim 1 wherein the lips lies in planes which intersect one another in a direction toward the magnetic member.

4. The process of claim 1 wherein both lips have substantially perpendicular edges.

5. The process of claim 2 wherein both lips have substantially perpendicular edges.

6. The process of claim 1 wherein the height of the toner image on the magnetic member prior to passage of air due to the suction device is from 0.5 to 5 mils.

7. The process of claim 1 wherein a vacuum within the suction device is 0.1 to 0.5 inches H$_2$O.

8. The process of claim 1 wherein the distance between the lip configuration forming the initial passage of air between the magnetic member and the suction device is in the range from 5 to 20 mils.

9. The process of claim 1 wherein the circular configuration of the magnetic member forms a circumference of not less than 15 inches.

10. The process of claim 1 wherein the lip configuration is symmetrical.

11. The process of claim 3 wherein the lip configuration is symmetrical.

* * * * *